United States Patent
Aoki et al.

(10) Patent No.: US 6,934,155 B2
(45) Date of Patent: Aug. 23, 2005

(54) APPARATUS AND METHOD FOR A COOLING SOLUTION FASTENING ASSEMBLY

(75) Inventors: Russell S. Aoki, Tacoma, WA (US); Daniel P. Carter, Bainbridge Island, WA (US); Patrick S. Johnson, Olympia, WA (US); Curtis J. Koepsell, Kent, WA (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 10/460,619

(22) Filed: Jun. 11, 2003

(65) Prior Publication Data

US 2004/0253077 A1 Dec. 16, 2004

(51) Int. Cl.$^7$ ................................................ H05K 7/20
(52) U.S. Cl. ...................... 361/704; 411/508; 411/349; 411/511; 411/518; 411/521; 257/718; 24/453; 165/80.3
(58) Field of Search ............................... 411/508, 509, 411/510, 511, 518, 521, 297, 913, 349, 553; 174/16.3; 24/453, 297, 457, 458; 361/704; 165/80.3; 257/718

(56) References Cited

U.S. PATENT DOCUMENTS

| | | | | |
|---|---|---|---|---|
| 2,936,015 A | * | 5/1960 | Rapata | 411/182 |
| 3,836,704 A | * | 9/1974 | Coules | 174/138 D |
| 3,988,808 A | * | 11/1976 | Poe et al. | 24/326 |
| 4,176,428 A | * | 12/1979 | Kimura | 24/326 |
| 4,647,262 A | * | 3/1987 | Yokota | 411/44 |
| 4,784,550 A | * | 11/1988 | Wollar | 411/32 |
| 4,970,761 A | * | 11/1990 | Nakamura | 24/453 |
| 5,223,674 A | * | 6/1993 | Reznikov | 174/138 D |
| 5,754,412 A | * | 5/1998 | Clavin | 361/804 |
| 6,307,748 B1 | * | 10/2001 | Lin et al. | 361/704 |
| 6,377,445 B1 | * | 4/2002 | Davis et al. | 361/683 |
| 6,514,023 B2 | * | 2/2003 | Moerke | 411/45 |

* cited by examiner

*Primary Examiner*—Robert J. Sandy
*Assistant Examiner*—David Reese
(74) *Attorney, Agent, or Firm*—Blakely, Sokoloff, Taylor & Zafman LLP

(57) ABSTRACT

A fastener assembly including a base consisting of a pair of motherboard snaps on a first end and a hollow shaft on a second end, the motherboard snaps to be inserted through an aperture of a motherboard. The hollow shaft is inserted through an aperture of a heat sink clip. The base further includes a pair of grooves on an exterior of the shaft. The assembly further including a cap consisting of a hollow interior, an integrated post attached to a base of the interior, and a pair of cantilever snaps. The cap is fitted over the exterior surface of the hollow shaft of the base to secure the clip between the base and the cap. The integrated post of the cap to be inserted into the hollow shaft of the base to deflect the motherboard snaps outward on an opposite side of the motherboard aperture to secure the assembly with the motherboard. The cantilever snaps to be positioned in the grooves of the shaft of the base to secure the cap with the base.

21 Claims, 6 Drawing Sheets

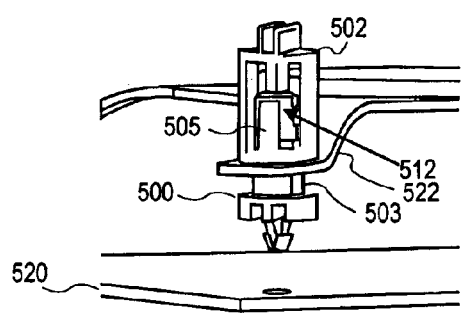
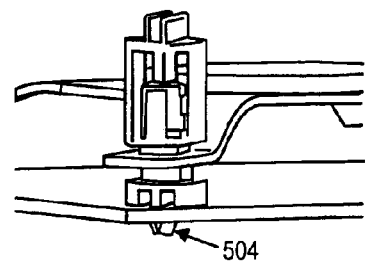
FIG. 5A              FIG. 5B
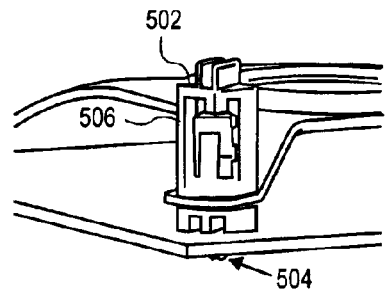
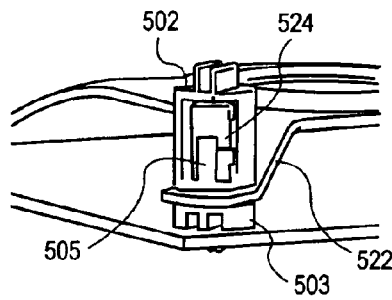
FIG. 5C              FIG. 5D

APPARATUS AND METHOD FOR A COOLING SOLUTION FASTENING ASSEMBLY

TECHNICAL FIELD

Embodiments described herein relate to a fastening assembly for cooling solutions.

BACKGROUND

Current designs for fastening cooling solutions to motherboards typically require retention mechanisms that are pre-assembled to the motherboard. This results in a complex design, with less room on the board for electrical components, and an added assembly step at the motherboard assembly line. Therefore a need exists to eliminate the integration of mechanical parts to be assembled at the board factory.

Current designs also typically require tool installation with high insertion forces and multiple axis movements to engage clips to motherboards. Therefore, a need exists for a fastening assembly that does not require tools to install the assembly.

In addition, in current designs, removal of heat sink assemblies can include having to remove the motherboard from the chassis to get access to the secondary side of the board. Therefore a needs exist to be able to remove a heat sink assembly without having to remove the motherboard from the chassis to get access to the secondary side of the board.

BRIEF DESCRIPTION OF DRAWINGS

FIGS. 5a–d illustrate the method of attaching the assembly to the motherboard to secure the heat sink clip, according to one embodiment.

DETAILED DESCRIPTION

A fastening apparatus and method to fasten a heat sink to a motherboard is described. In one embodiment, the fastener includes a base and a cap, which are used to secure heat sink clips to the motherboard. In one embodiment, the base provides the geometry to fasten the assembly to the motherboard. The base also contains features that allow the cap to snap into the base in multiple locations. The cap secures the heat sink clip to the base.

In the following description, numerous specific details are set forth. However, it is understood that embodiments may be practiced without these specific details. In other instances, well-known circuits, structures and techniques have not been shown in detail in order not to obscure the understanding of this description.

Reference throughout this specification to "one embodiment" or "an embodiment" indicate that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
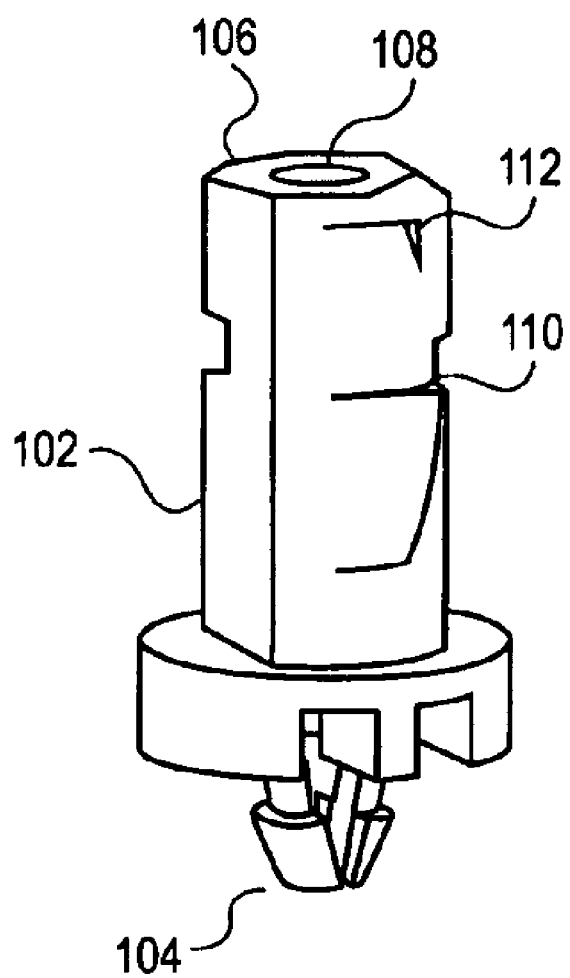
FIG. 1 illustrates a base of the fastener assembly according to one embodiment.

FIG. 1 is an illustration of one embodiment of the base 102. In one embodiment, the base includes a pair of motherboard (MB) snaps 104 at a first end of the base, which are to be inserted through an aperture of a motherboard. The base includes a hollow shaft 106 with an opening 108 at a second end opposite of the first end of the base. The shaft 106 is to be inserted through an aperture of a heat sink clip.

In one embodiment, the base further includes a first set of grooves 110 on an exterior of the shaft to secure the cap to the base, and trap the heat sink between. In yet another embodiment, the base further includes an additional set of grooves 112 on the exterior of the shaft, above the first set of grooves 110. The second set of grooves 112 are to retain the cap to the base in a preassembly of the base 102, cap 202, and heat sink clip, wherein the heat sink clip is able to travel between the cap and the base before the cap is snapped into a final position with base.

Figure 2:
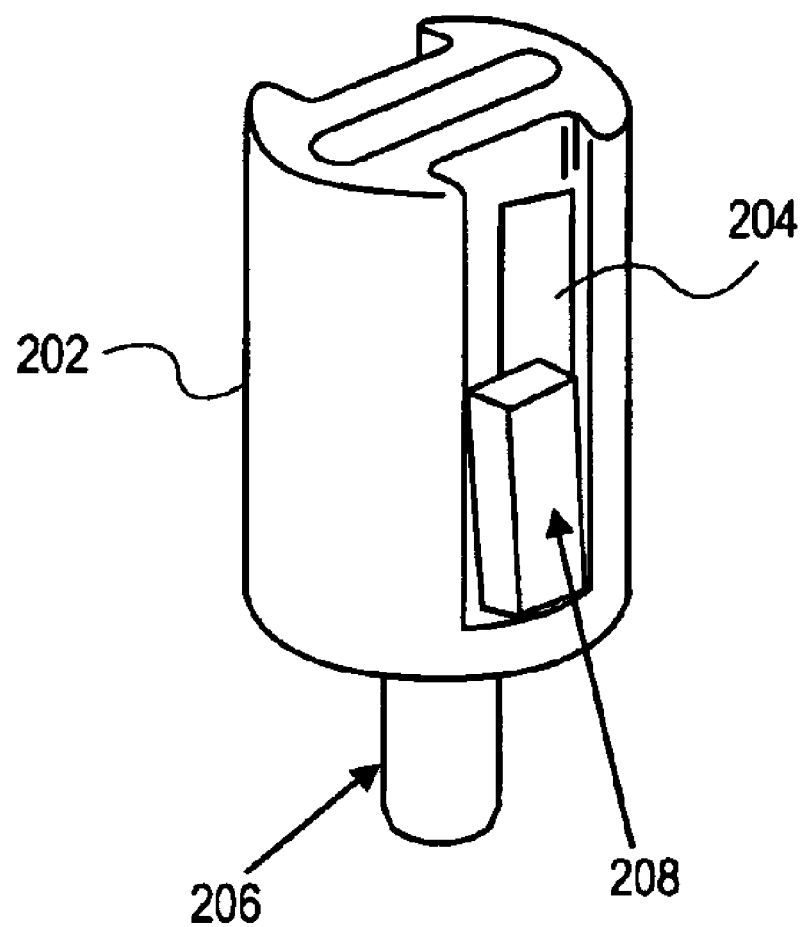
FIG. 2 illustrates a cap of the fastener assembly according to one embodiment.
Figure 3:
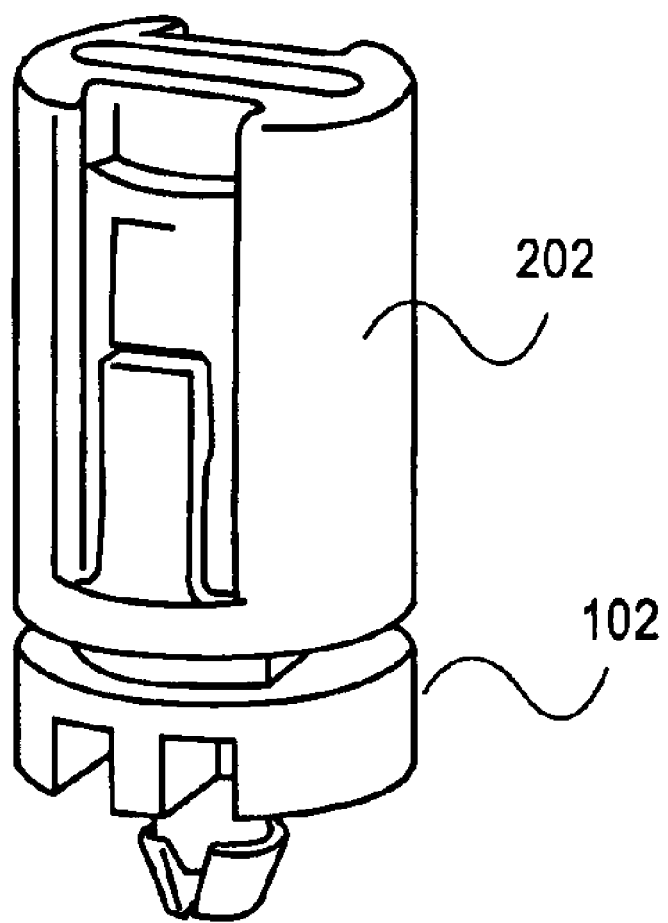
FIG. 3 illustrates the cap joined with the base according to one embodiment.

FIG. 2 illustrates one embodiment of the cap 202. As illustrated, the cap 202 includes a hollow interior 204, an integrated post 206, and a set of cantilever snaps 208. As illustrated in FIG. 3, the cap 202 is fitted over the exterior of the shaft 106 of the base. The integrated post 206 of the cap is inserted through the opening 108 of the hollow shaft 106 of the base. And the cantilever snaps 208 to be positioned into one of the groove sets on the exterior of the base 102 to retain and/or secure the cap 202 with the base 102.

Figure 4:
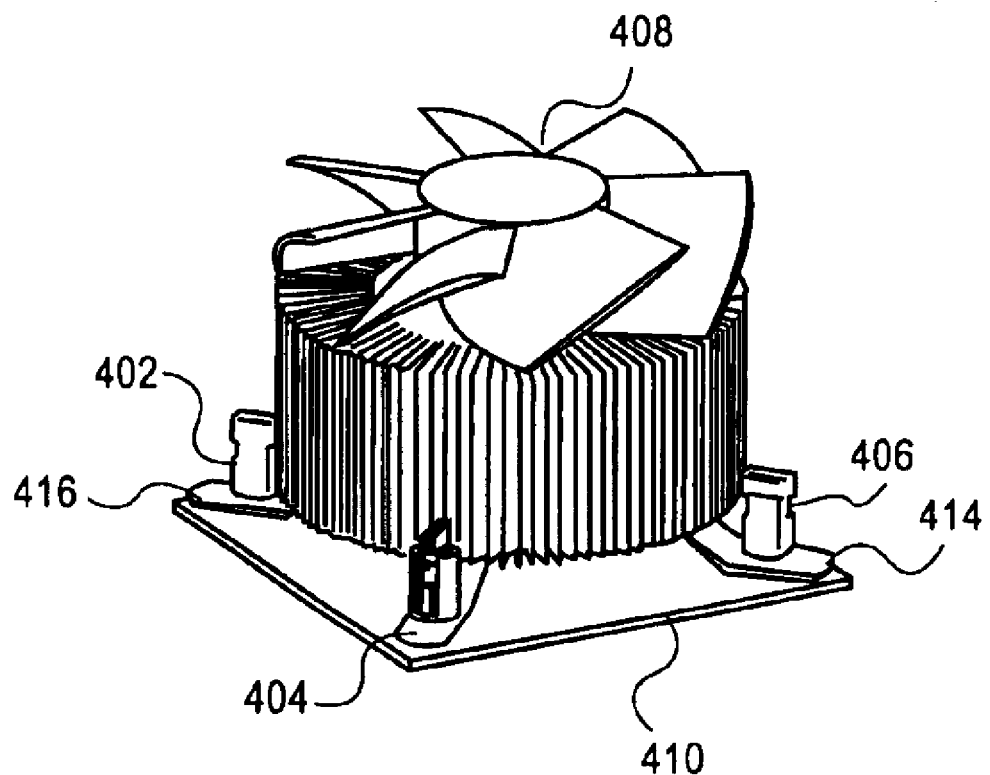
FIG. 4 illustrates fastener assembly fastening a heat sink to a motherboard according to one embodiment.

FIG. 4 illustrates the use of multiple fasteners 402, 404, 406 used to secure a heat sink 408 to the mother board 410, via the heat sink clips 412, 414, 416 secured between the base and the cap of the fastener assemblies. The actual number of fasteners used to secure a heat sink to the mother board is a choice of implementation. The heat sink clips may secure a heat sink against a processor, a chip set, or some other heat generating component.

FIGS. 5a–d illustrate the method of attaching the assembly 500 to the motherboard 520 to secure the heat sink clip 522. In FIG. 5a the assembly 500 is positioned over an aperture of the motherboard 520. As illustrated, in one embodiment, the cap 502 and the base 503 are preassembled to the clip 522, which decreases the need for the integration of mechanical parts to be assembled at the board factory. In the preassembly, the cantilever snaps 505 of the cap are positioned initially in the second set of grooves 512 of the base 502. In one embodiment, the force required to deflect the cantilever snaps into the second set of grooves 512 is overcome at preassembly.

As illustrated in FIG. 5b, the assembly is lowered to the motherboard to align the MB snaps 504 with the aperture of the motherboard. In one embodiment, the MB snaps 504 are freely inserted through the aperture of the motherboard without interference. In one embodiment, as illustrated in FIG. 5b, when the assembly is preassembled, there is a small amount of room (e.g., 2.5 mm) for the clip to travel between the base and the cap, to allow for tolerances and to help create a preload against the clip when the cap and base are in final position.

As illustrated in FIG. 5c a load is applied to the cap 502 to create force to have the post 506 of the cap deflect the MB snaps 504 on an opposite side of the motherboard to secure the base to the motherboard. In FIG. 5d, a second load is applied to the cap 502 to create a preload against the heat sink clip 522. A third load applied places the cap 502 and the base 503 in a final position, with the cantilever snaps 505 of the cap positioned in the first set of grooves 524 of the base. Further more, when in final position, the cap secures the clip between the base and the cap.

As described above, in one embodiment the assembly does not require any separate tools for installation. In one embodiment, the installer only needs to apply a staggered vertical load downward to install each of the fasteners with the use of their finger.

The installation of the base and cap stagger the loads in the fastening assembly to reduce the insertion forces. In one embodiment, there are 3 phases to the insertion force when installing the assembly. The load to: 1) deflect the MB snap of the base, 2) create the clip preload, and 3) the deflection of the cantilever snaps into the set of grooves on the exterior of the base to lock the cap and base together. As a result, the installation of the assembly reduces the amount of insertion load by staggering each of the 3 installation phases, rather than all at once. Each of the 3 phases is done at separate stages of cap travel.

Figure 6:
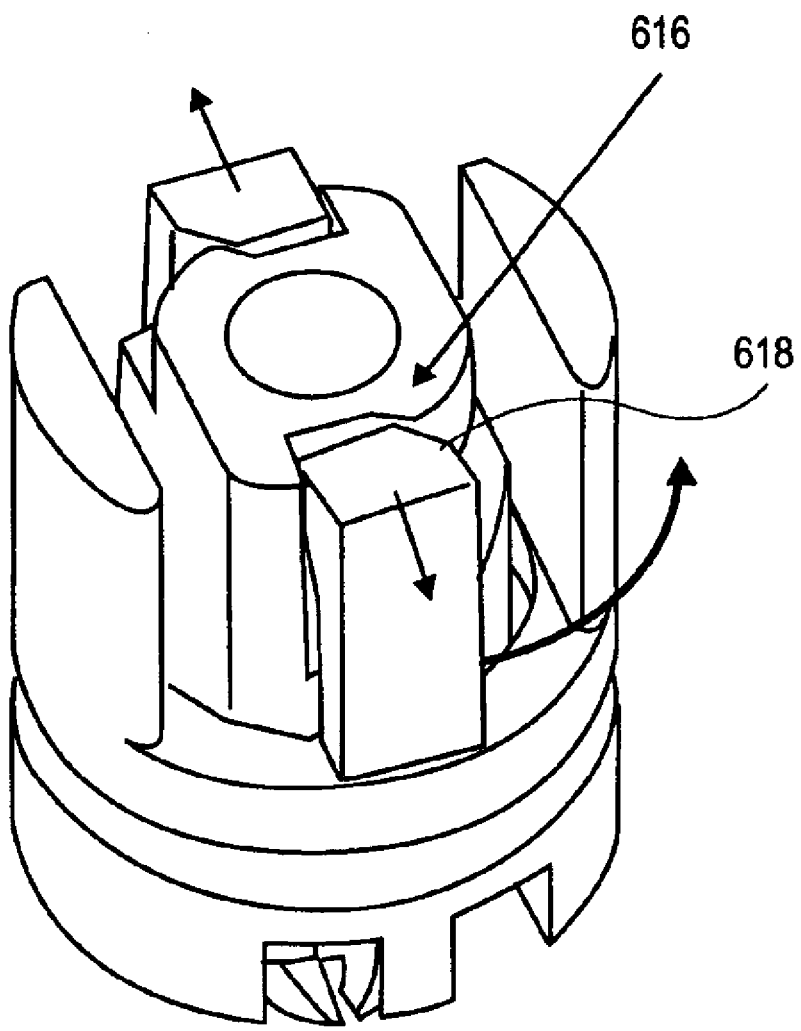
FIG. 6 illustrates the disassembly of the cap from the base according to one embodiment.

Disassembly of the fastener assembly is also efficient. In particular, as illustrated in FIG. 6, in one embodiment the exterior surface of the base shaft further includes a cam surface 616 approximately adjacent to the set of grooves. In addition, in one embodiment, an interior surface of the cantilever snaps includes a cam surface 618 opposing the cam surface 616 of the base shaft.

The cap is to be disassembled from the base by rotating the cap to have the cam surface of the cantilever snap 618 oppose the cam surface 616 of the base shaft to deflect the cantilever snaps outward out of the groove of the base shaft, to remove the cap from the base. In one embodiment, the cap need only be rotated one quarter of a turn.

In one embodiment, removal of the cap from the base does not require tools, the user may remove the cap from the base by rotating the cap through the use of their fingers. Alternatively, a geometry may be include on a top surface of the cap to allow for the use of a tool to rotate the cap for removal from the base.

These embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. An apparatus comprising:
a base consisting of a pair of motherboard snaps on a first end and a hollow shaft on a second end, the motherboard snaps to be inserted through an aperture of a motherboard, and the hollow shaft to be inserted through an aperture of a clip, and at least a first groove on an exterior of the shaft; and
a cap consisting of a hollow interior, an integrated post attached to a base of the interior, and at least one cantilever snap, the cap to be fitted over the exterior surface of the hollow shaft of the base to secure the clip between the base and the cap, the integrated post of the cap to be inserted into the hollow shaft of the base to deflect the motherboard snaps outward on an opposite side of the motherboard aperture to secure the assembly with the motherboard, and the cantilever snap to be positioned in the groove of the shaft of the base to secure the cap with the base.

2. The apparatus of claim 1, wherein the clip is attached to a heat sink device.

3. The apparatus of claim 1, wherein the motherboard snaps are to be inserted in the aperture of the motherboard with no interference.

4. The apparatus of claim 1, wherein the cap includes a pair of opposing cantilever snaps.

5. The apparatus of claim 1, wherein the exterior surface of the base shaft further includes a cam surface approximately adjacent to the groove, and an interior surface of the cantilever snaps includes a cam surface opposing the cam surface of the base shaft.

6. The apparatus of claim 5, wherein the cap is to be disassembled from the base by rotating the cap to have the cam surface of the cantilever snap oppose the cam surface of the base shaft to deflect the cantilever snap outward out of the groove of the base shaft.

7. The apparatus of claim 1, wherein the motherboard snaps of the base are deflected outward via a first load force.

8. The apparatus of claim 1, wherein the cantilever snaps of the cap are positioned into the grooves of the base shaft via a second load force.

9. The apparatus of claim 1, wherein assembly of the base to the motherboard and the cap to the base to secure the clip requires no separate tools.

10. The apparatus of claim 1, wherein disassembly of the base from the motherboard and the cap from the base requires no separate tools.

11. The apparatus of claim 1, wherein the cap and the base are preassembled to the clip.

12. The apparatus of claim 11, wherein the base includes a second groove above the first groove to retain the cap to the base in a preassembly.

13. A fastener assembly comprising:
a base consisting of a pair of motherboard snaps on a first end and a hollow shaft on a second end, the motherboard snaps to be inserted through an aperture of a motherboard with no interference, and the hollow shaft to be inserted through an aperture of a clip attached to a heat sink device, and at least a first pair of grooves on an exterior of the shaft; and
a cap preassembled to the base and clip, the cap consisting of a hollow interior, an integrated post attached to a base of the interior, and a pair of cantilever snaps, the cap to be fitted over the exterior surface of the hollow shaft of the base to secure the clip between the base and the cap, the integrated post of the cap to be inserted into the hollow shaft of the base to deflect the motherboard snaps outward on an opposite side of the motherboard aperture to secure the assembly with the motherboard via a first load force, and the cantilever snaps to be positioned in the groove of the shaft of the base to secure the cap with the base via a second load force.

14. The apparatus of claim 13, wherein the exterior surface of the base shaft further includes a cam surface approximately adjacent to the groove, and an interior surface of the cantilever snaps includes a cam surface opposing the cam surface of the base shaft.

15. The apparatus of claim 14, wherein the cap is to be disassembled from the base by rotating the cap to have the cam surface of the cantilever snap oppose the cam surface of the base shaft to deflect the cantilever snap outward out of the groove of the base shaft.

16. The apparatus of claim 13, wherein the base includes a second set of grooves above the first set of grooves to retain the cap to the base in a preassembly.

17. A method comprising:

inserting motherboard snaps of a base through an aperture of a motherboard, the base having a hollow shaft on an end opposite the snaps, and at least one groove on an exterior of the shaft;

fitting a cap over the exterior surface of the hollow shaft of the base securing a clip between the base and the cap, the clip attached to a heat sink device, the cap having an integrated post attached to a base of the interior, and at least one cantilever snap;

deflecting the motherboard snaps outward on an opposite side of the motherboard aperture by inserting the integrated post of the cap through the hollow shaft of the base; and positioning the cantilever snaps in the groove of the shaft of the base securing the cap with the base.

18. The method of claim 17, wherein inserting the motherboard snaps in the aperture of the motherboard includes inserting the snaps with no interference.

19. The method of claim 17, further including:

disassembling the cap from the base by rotating the cap to have a cam surface of the cantilever snap oppose a cam surface of the base shaft deflecting the cantilever snap outward out of the groove of the base shaft.

20. The method of claim 17, wherein the deflecting of motherboard snaps includes deflecting the snaps via a first load force; and positioning the cantilever snaps in the groove of the shaft of the base includes positioning into the grooves of the base shaft via a second load force.

21. The method of claim 17, wherein the method is performed assembly without the use of a separate tool.

* * * * *